United States Patent
Su (10) Patent No.: US 6,388,253 B1
(45) Date of Patent: May 14, 2002

(54) INTEGRATED CRITICAL DIMENSION CONTROL FOR SEMICONDUCTOR DEVICE MANUFACTURING

(75) Inventor: Bo Su, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/703,801

(22) Filed: Nov. 2, 2000

Related U.S. Application Data (62) Division of application No. 09/342,805, filed on Jun. 29, 1999, now abandoned.

(51) Int. Cl.⁷ .............................................. G01N 23/225
(52) U.S. Cl. ............... 250/310; 250/492.2; 250/492.23; 250/252.1; 324/158.1; 324/765; 438/494; 438/14
(58) Field of Search ...................... 250/492.23, 492.2, 250/310, 252.1; 324/158.1, 765; 438/494, 14

(56) References Cited

U.S. PATENT DOCUMENTS

| | | | | |
|---|---|---|---|---|
| 4,447,731 A | | 5/1984 | Kuni et al. ............... | 250/442.1 |
| 5,109,430 A | * | 4/1992 | Nishihara et al. ............... | 382/8 |
| 5,926,690 A | | 7/1999 | Toprac et al. .................. | 438/17 |
| 6,001,699 A | * | 12/1999 | Nguyen et al. ............. | 438/305 |
| 6,054,710 A | | 4/2000 | Bruggeman ................. | 250/307 |
| 6,148,239 A | * | 11/2000 | Funk et al. ..................... | 700/1 |
| 6,175,417 B1 | * | 1/2001 | Do et al. ..................... | 356/392 |
| 6,245,581 B1 | | 6/2001 | Bonser et al. ................. | 438/8 |

FOREIGN PATENT DOCUMENTS

| | | |
|---|---|---|
| EP | 0 727 715 | 8/1996 |
| JP | 61-290312 | 12/1986 |

OTHER PUBLICATIONS

"Analysis of Reflectometry and Ellipsometry Data From Patterned Structures" by Lee et al., Characterization and Metrology for ULSI Technology: 1998 International Conference, pp. 331–335.

(List continued on next page.)

Primary Examiner—Bruce Anderson
Assistant Examiner—Nikita Wells
(74) Attorney, Agent, or Firm—Mcdermott Will & Emery; Joseph Bach

(57) ABSTRACT

A method and apparatus for reducing lot to lot CD variation in semiconductor wafer processing feeds back information gathered during inspection of a wafer, such as after photoresist application, exposure and development, to upcoming lots that will be going through the photolithography process, and feeds forward information to adjust the next process the inspected wafer will undergo (e.g., the etch process). Embodiments include forming a feature such as an etch mask on a semiconductor wafer at a "photo cell" by a photolithography process, then conventionally imaging the feature with a CD-SEM to measure its CD and other sensitive parameters. The measured parameters are linked, via the feature's SEM waveform, to photolithography adjustable parameters such as stepper focus and exposure settings. If the measured parameters deviate from design dimensions, the linked information on focus and exposure is fed back to the photo cell so the stepper can be adjusted, either automatically or at the user's discretion, to correct the deviation in following lots. The measured parameters are also linked to etch process adjustable parameters such as etch recipes for different over-etch and/or etch chemistry. If the measured parameters deviate from desired values, a linked etch recipe to correct the error is fed forward to the etcher and implemented automatically or at the user's discretion. This feedback and feed-forward mechanism improves lot to lot CD control at inspection following photoresist development and at final inspection as well.

20 Claims, 9 Drawing Sheets

OTHER PUBLICATIONS

"An Inverse Scattering Approach to SEM Line Width Measurements" by Davidson et al., Technical Program and Abstract Digest, SPIE's 24th International Symposium on Microlithography, Mar. 1999, Santa Clara, CA.

Raymond, Christopher J., "Angle–Resolved Scatterometry for Semiconductor Manufacturing", *Microlithography World*, Winter 2000, pp. 18–23.

Anthony J. Toprac, "AMD's Advanced Process Control of Poly–gate Critical Dimension", SPIE Conference on Process, Equipment and Materials Control in Integrated Circuit Manufacturing, Sep. 1999, Santa Clara, CA, SPIE vol. 3882.

McIntosh, J. M., et al., "Approach to CD SEM Metrology Utilizing the Full Waveform Signal"Proceedings of the SPIE, vol. 3332, pp. 51–60, Feb. 23, 1998.

* cited by examiner

FIG. 1

|   | A | B | C | D | E |
|---|---|---|---|---|---|
| | $\Delta f_4 \Delta E_0$ | $\Delta f_4 \Delta E_1$ | $\Delta f_4 \Delta E_2$ | $\Delta f_4 \Delta E_3$ | $\Delta f_4 \Delta E_4$ |
| | $\Delta f_3 \Delta E_0$ | $\Delta f_3 \Delta E_1$ | $\Delta f_3 \Delta E_2$ | $\Delta f_3 \Delta E_3$ | $\Delta f_3 \Delta E_4$ |
| | $\Delta f_2 \Delta E_0$ | $\Delta f_2 \Delta E_1$ | ✕ | $\Delta f_2 \Delta E_3$ | $\Delta f_2 \Delta E_4$ |
| | $\Delta f_1 \Delta E_0$ | $\Delta f_1 \Delta E_1$ | $\Delta f_1 \Delta E_2$ | $\Delta f_1 \Delta E_3$ | $\Delta f_1 \Delta E_4$ |
| | $\Delta f_0 \Delta E_0$ | $\Delta f_0 \Delta E_1$ | $\Delta f_0 \Delta E_2$ | $\Delta f_0 \Delta E_3$ | $\Delta f_0 \Delta E_4$ |
|   | A | B | C | D | E |

INTEGRATED CRITICAL DIMENSION CONTROL FOR SEMICONDUCTOR DEVICE MANUFACTURING

This Application is a Division of Ser. No. 09/342,805 filed Jun. 29, 1999 abandoned.

FIELD OF THE INVENTION

The present invention relates to a method and apparatus for monitoring and controlling processing carried out on a semiconductor substrate, and more particularly for controlling critical dimensions (CDs) of features formed on the semiconductor substrate through feedback and feed-forward of information gathered during in-process inspection of the features. The invention has particular applicability for in-line inspection of semiconductor wafers during manufacture of high-density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer) which has been previously coated on a layer, such as a polysilicon or metal layer, formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. The design rule limitation is referred to as the critical dimension ("CD"), defined as the smallest width of a line or the smallest space between two lines permitted in the fabrication of the device. The CD for most ultra large scale integration applications is on the order of a fraction of a micron.

As design rules shrink and process windows (i.e., the margins for error in processing) become smaller, inspection and measurement of surface features' CD, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate processing problems, such as stepper defocusing or photoresist loss due to over-exposure.

Thus, CD and profile values, and the variation of feature CD from design dimensions, are important indicators of the accuracy and stability of the photoresist and etch processes, and "CD control" to reduce such variation is an important part of semiconductor processing. CD control necessarily involves monitoring and adjusting both the photolithography and etch processes to address CD variations from field to field (FTF) within a wafer, from wafer to wafer (WTW) and from lot to lot (LTL). Among FTF, WTW and LTL variation, FTF and LTL are dominant variation components, while WTW typically counts for less than 10% of the total CD variation. FTF variation is generally determined by process tool performance, such as photoresist coating and baking uniformity, stepper or scanner stage leveling, and etch micro-loading uniformity. On the other hand, LTL variation is generally determined by process stability, including process equipment stability.

Because of the extremely small scale of current CD's, the instrument of choice for measurement and inspection of surface features produced by photolithographic processing is a scanning electron microscope (SEM) known as a "critical dimension scanning electron microscope" (CD-SEM). Although conventional SEM's are useful for measuring CD's, they generally do not provide immediate feedback to the photolithography process to reduce LTL variations, and the results of conventional inspections are not typically used to adjust subsequent etch processing. Furthermore, conventional CD-SEMs cannot provide an adequately detailed direct image or measurement of feature profiles. Still further, conventional methods of direct inspection of feature profiles are destructive to the sample under inspection, are time-consuming, or both.

There exists a need for a simple, cost-effective methodology for fast and meaningful identification and correction of lot to lot CD variation without significantly reducing production throughput.

SUMMARY OF THE INVENTION

An advantage of the present invention is the ability to reduce lot to lot CD variations in semiconductor wafers without reducing production throughput, by utilizing information gathered during in-process inspection of the wafers.

According to the present invention, the foregoing and other advantages are achieved in part by a method of controlling the processing of a semiconductor wafer, which method comprises performing a first process on the wafer and obtaining characteristics of a target feature on the wafer formed using the first process. A set of process parameter values for a second process is determined based on the target feature characteristics, and the second process is then performed on the wafer based on the second process parameter values. Additionally, a set of process parameter values is determined for the first process responsive to the target feature characteristics, and the first process is performed on another semiconductor wafer responsive to the first process parameter values.

Another aspect of the present invention is an apparatus for carrying out the steps of the above method.

A still further aspect of the present invention is a computer-readable medium bearing instructions for controlling the processing of a semiconductor wafer, the instructions, when executed, being arranged to cause one or more processors to perform the steps of the above method.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for in-process inspection of features formed on the surface of semiconductor wafers are not capable of analyzing CD and/or profile deviations from design rules in sufficient detail to provide information leading to early positive identification of the source of the defect or enabling process control to reduce dimensional variation. The present invention addresses the problem of CD control by reducing the lot to lot CD variation by feeding back information gathered during inspection of a wafer (e.g., after photoresist development) to upcoming lots that will be going through the photolithography process, and by feeding forward information to adjust the next process the inspected wafer will undergo (e.g., the etch process).

According to the methodology of the present invention, after a feature such as an etch mask is formed on a lot or batch of semiconductor wafers at a "photo cell" by a photolithography process (e.g., exposure at a stepper followed by photoresist development), one or more wafers of the lot are chosen for inspection and the feature is conventionally imaged, typically at several sites on each wafer to be inspected, with a CD-SEM to measure its CD and other sensitive parameters such as edge width and profile grade, and to obtain its SEM waveform. The measured parameters are linked to photolithography adjustable parameters such as stepper focus and exposure settings. Thus, if the measured parameters deviate from design dimensions, the linked information on focus and exposure can be fed back to the photo cell so the stepper can be adjusted, either automatically or at the user's discretion, to correct the deviation in following lots. Furthermore, the measured parameters are also linked to etch process adjustable parameters such as etch recipes for different over-etch and/or etch chemistry. Therefore, if the measured parameters deviate from desired values, a linked etch recipe to correct the error can be fed forward to the etcher, which recipe can be implemented automatically or at the user's discretion to process the wafers in the inspected lot. Thus, the feedback and feed-forward mechanism of the present invention improves lot to lot CD control at inspection following photoresist development and at final inspection.

The links between the measured feature parameters, the photolithography adjustable parameters and etch adjustable parameters is accomplished through "library building". Specifically, in one embodiment of the present invention, a "library" of reference waveforms, such as conventional SEM waveforms, is created by imaging a plurality of reference features formed, as on a test wafer in the photo cell, using the reticle which will be used in producing the features to be inspected. Each of the reference features is formed using different process parameters, such as different stepper focus and exposure settings. After creating the reference SEM waveforms, the profile of each of the reference features is imaged, if desired, as by a cross-section FIB-SEM. Thus, each reference SEM waveform is associated with known stepper settings and, optionally, a known profile. Additionally, an etch recipe that, when used with a reference feature, will result in a finished feature with a desired CD, is linked with each reference waveform. In other words, an etch recipe that will compensate for deviations in the reference feature is linked to each reference feature. Subsequently, the reference waveform associated with the particular cross-section SEM waveform having optimal CD, profile and/or other characteristics is chosen and identified as a "golden waveform".

A feature of unknown CD is conventionally imaged with an SEM, and the resulting waveform is compared to the golden waveform. If the feature's waveform does not substantially match the golden waveform, it is compared to the reference feature waveforms to find the closest matching reference waveform. The profile and stepper settings of the matching reference waveform (which correspond to the profile and stepper settings of the feature under inspection) can then be compared to those associated with the golden waveform and fed back to the photo cell for automatic or manual process adjustment. Furthermore, the etch recipe of the matching reference waveform can be fed forward to the etcher to adjust the CDs of the features of the wafers in the lot under inspection resulting from the etch process. Thus, stepper focus and exposure settings of sample features from a lot under inspection are pinpointed, and an optimal etch recipe for the lot determined, by obtaining each feature's SEM waveform and comparing the waveform to a library of reference feature waveforms, thereby enabling feedback to the photo cell and feed-forward to the etcher to adjust process parameters to reduce lot to lot CD variation.

In a preferred embodiment of the invention, the library of reference waveforms is formed as a focus exposure matrix ("FEM") on a test wafer, which is a conventional technique for obtaining the best exposure/focus combination when new masks are produced or after a change in the fabrication recipe; i.e., to optimize the process by finding the combination of stepper focus and exposure which results in the best resolution on the wafer, in keeping with the required CD. The FEM procedure typically comprises sequentially exposing a series of areas of the test wafer with the pattern of the mask, while exposure and focus values are incrementally changed from one exposure location to the next. Specifically, the test wafer is exposed in a stepper while the focus is varied along one axis and the exposure is varied along the other. Thus, a matrix of features is obtained on the exposed wafer, wherein each exposure site or die has a different focus-exposure setting.

Figure 1:
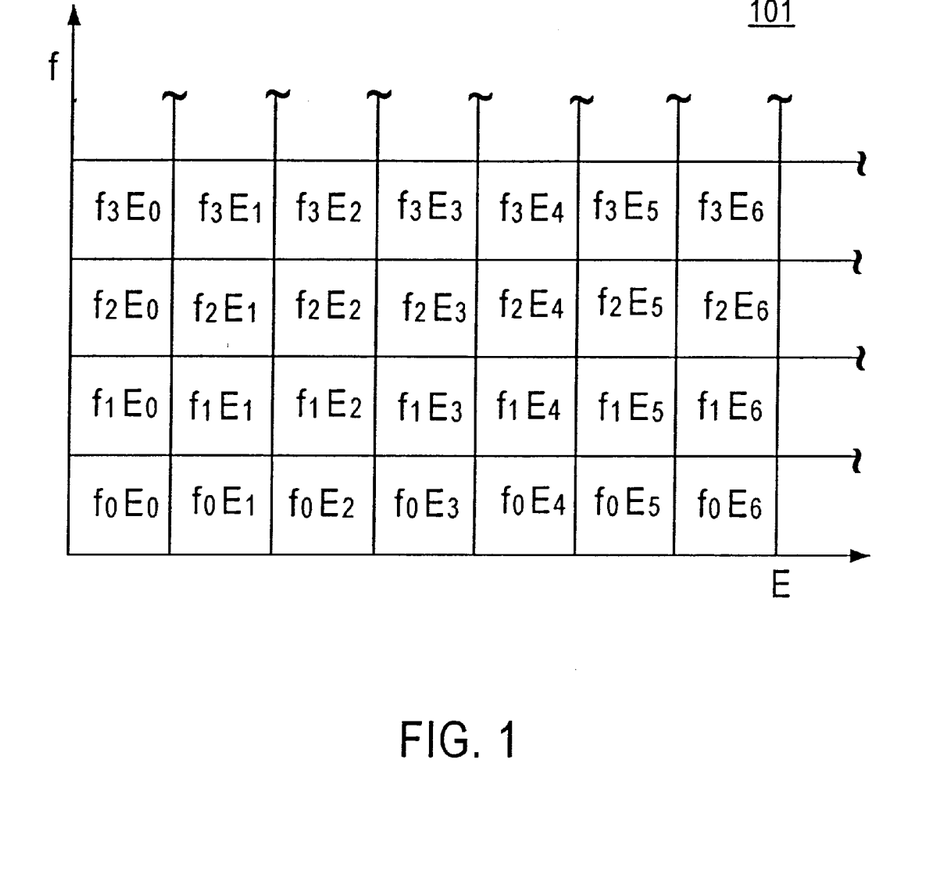
FIG. 1 illustrates a portion of a focus exposure matrix used in practicing an embodiment of the present invention.

FIG. 1 illustrates a portion of a focus-exposure matrix. The matrix 101 is formed by patterning the wafer surface using light or other radiation passing through the mask. A single wafer may include tens or hundreds of dies depending on die size, each of which corresponds to one of the exposure areas, or "cells", shown in FIG. 1. For convenience, only a small number of the dies are illustrated. Each of the cells of the matrix has an incrementally different exposure E and/or was formed with an incrementally different focus f than any of the surrounding cells, as referenced by nomenclature $f_n E_m$ in the drawings. The focus is varied along one axis while the exposure is varied along the other axis in the formation of the matrix.

After exposure of the wafer, the individual exposure sites are developed and then examined with a conventional CD-SEM scan to measure the feature's CD, and the resulting waveforms stored to obtain a reference waveform for each site. The exposure sites can then be imaged, if desired, with an atomic force microscope (AFM) or sectioned and imaged with a cross-section FIB-SEM to determine their respective profiles. An evaluation of the CD, cross-sectional profile images, and other measured parameters is performed to determine the combination of focus and exposure settings which produces the best feature characteristics. The reference waveform (i.e., conventional SEM waveform) corresponding to the combination of stepper focus and exposure settings that produced the best characteristics is then designated as a golden waveform. Each reference waveform is further associated with an etch recipe experimentally determined to be the optimal recipe to produce a finished feature (after etching) with a CD as close as possible to design dimensions, given the measured CD and other characteristics of the reference feature (i.e., the etch mask).

Figure 2A:
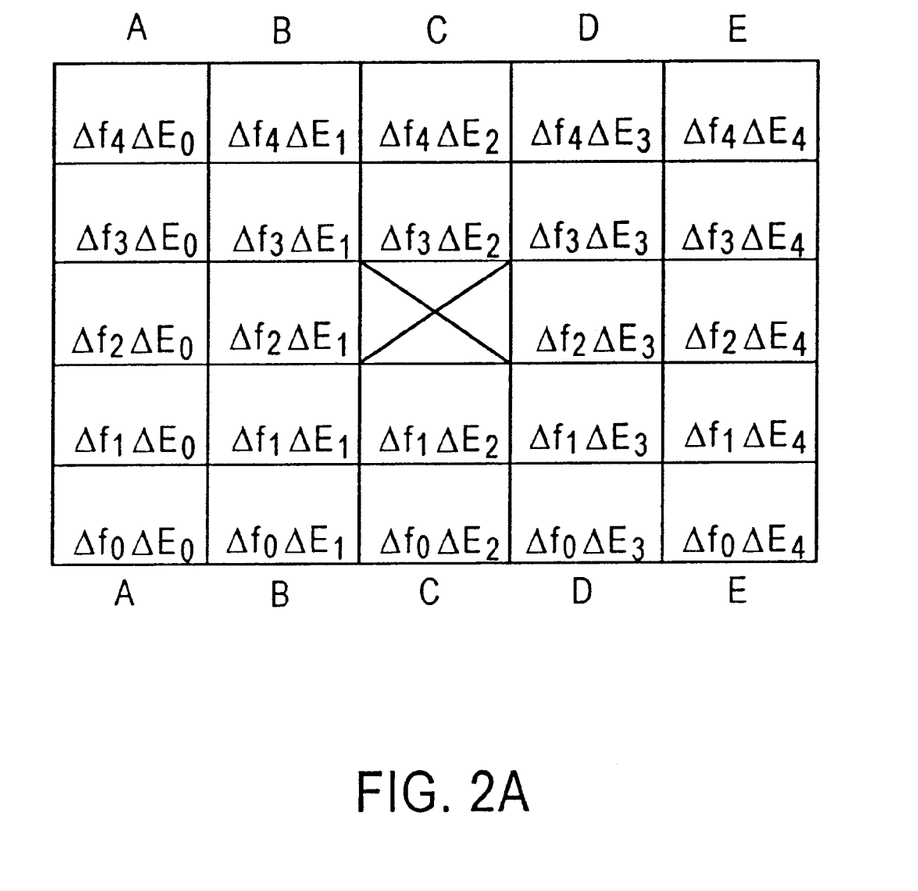
FIGS. 2A and 2B are conceptual illustrations of the reference library used in practicing an embodiment of the present invention.
Figure 2B:
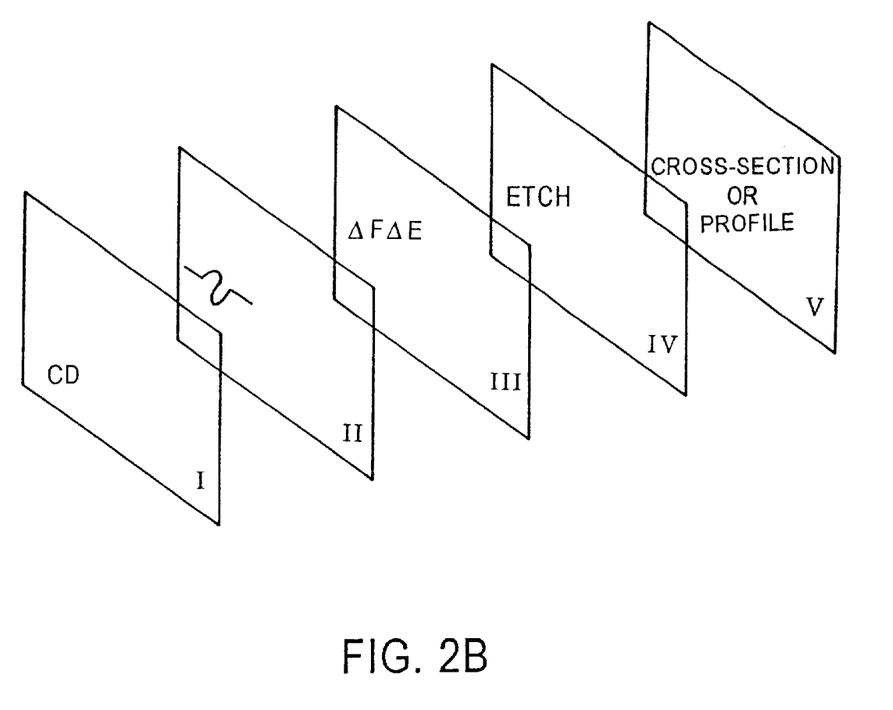

The concept of the reference library of the present invention is illustrated in FIGS. 2A and 2B. In FIG. 2A, which is based on the FEM of FIG. 1, the optimized process condition is represented by the cell marked "x". All other cells preferably cover a reasonable range of process variation, or the "process window", wherein $\Delta f_n$ and $\Delta E_m$ are each measured as the difference from cell x; that is, $\Delta f$ and $\Delta E$ are both zero in cell x, and $\Delta f$ and $\Delta E$ of the other cells are exposure doses and focus settings relative to the optimal exposure and focus. Each exposure column A–E represents a different etch recipe. Since the etch recipe adjustment applies only to CD, not profile, the etch recipes' assignments are aligned with the exposure columns. FIG. 2B represents an expansion of each cell of FIG. 2A. A measured CD value (e.g., in box I) and an SEM waveform (e.g., in box II) are linked within a cell to $\Delta f_n \Delta E_m$ (e.g., in box III), to an etch recipe (e.g., in box IV) and to a cross section or image of the profile of the inspected feature (e.g., in box V).

Figure 3:
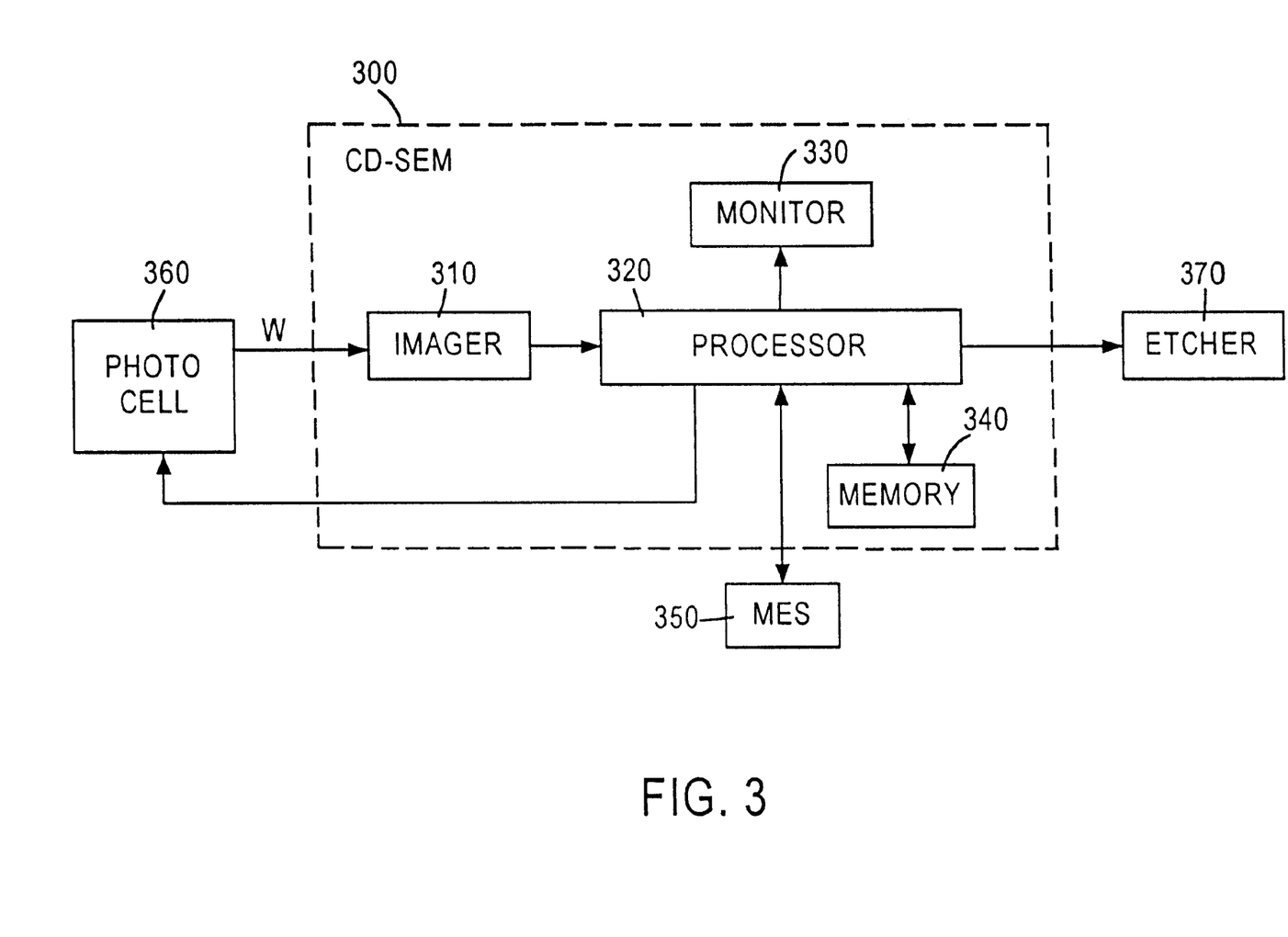
FIG. 3 is a block diagram of a review tool according to an embodiment of the present invention.

The present invention is implemented at a review tool 300, as shown in FIG. 3, comprising an imager 310, preferably a CD-SEM such as the VeraSEM™ available from Applied Materials of Santa Clara, Calif. Review tool 300 further comprises a processor 320, which preferably performs the analysis disclosed herein electronically, and a monitor 330 for displaying results of the analyses of processor 320. Processor 320 can be in communication with a memory device 340, such as a semiconductor memory, and a computer software-implemented database system 350 known as a "manufacturing execution system" (MES) conventionally used for storage of process information. Processor 320 is also in communication with previously-described photo cell 360 and etcher 370.

Figure 4A:
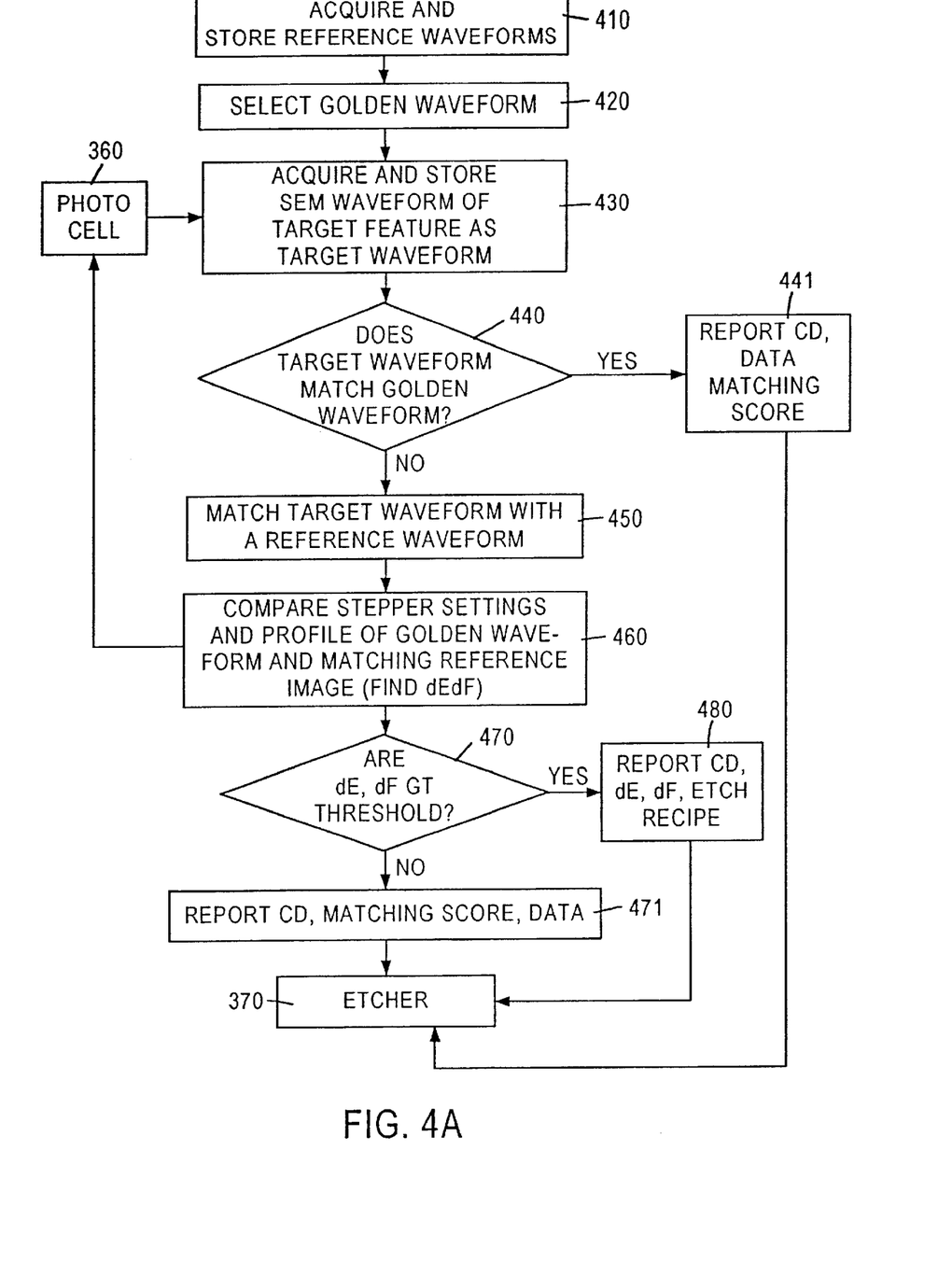
FIGS. 4A and 4B are flow charts illustrating sequential steps in methods according to embodiments of the present invention.

FIG. 4A is a flow chart illustrating the major steps of process control according to an embodiment of the present invention, implemented in conjunction with inspecting a feature (hereinafter called a "target feature") such as an etch mask formed on a semiconductor wafer W at photo cell 360. At step 410, the reference library is created, including reference CDs and waveforms in the form of SEM waveforms, and stored locally in inspection tool 300 or in MES 350. The stepper settings associated with each of the reference waveforms and the appropriate etch recipes are stored along with the waveforms. Profile images can also be stored, if desired by the user. The reference library is created only once for each layer to be inspected, such as when a series of process steps, such as photo cell 360, creates a "critical layer" that the user determines must be inspected. The golden waveform; i.e., the waveform associated with the reference feature exhibiting optimal CD and/or other characteristics, is selected at step 420.

Wafer W, having features with unknown CD and other characteristics, is brought to imager 310 from photo cell 360, the target feature is imaged by imager 310 at step 430, and its waveform is stored as a target waveform. At step 440, the target waveform is compared to the stored golden waveform. If the target waveform and golden waveform match within predetermined limits, the CD of the target feature is reported to the user, as by a display on monitor 330, along with a "matching score" indicating the amount of deviation of the target waveform from the golden waveform (see step 441). The results (i.e., the data) from the inspection are then sent to MES 350, and wafer W is sent to etcher 370 for further.

If the target waveform does not match the golden waveform, the target waveform is compared to each of the reference waveforms in the library to identify the reference waveform most closely matching the target waveform (see step 450). The reported stepper settings are compared with those associated with the golden waveform at step 460 to determine the difference dEdF between the settings which produced the golden waveform and those which produced the target waveform; e.g., determine the difference between the focus setting associated with the golden waveform and the focus setting associated with the target waveform, and determine the difference between the exposure setting associated with the golden waveform and the exposure setting associated with the target waveform. This information is then sent to photo cell 360, where it is used to correct the stepper settings to minimize "drift" in the stepper, which would cause CD variations in subsequently processed wafers, by indicating the amount of adjustment to the stepper that is required, as well as which particular adjustments (i.e., focus, exposure, or both) should be made.

Next, dE and dF are compared to predetermined threshold values at step 470. If dE and dF are not greater than the predetermined threshold values, the CD and matching score of the target feature are reported at step 471, the data from the inspection is then sent to MES 350, and wafer W is sent to etcher 370. On the other hand, if dE and dF are greater than the predetermined threshold values, the CD and matching score of the target feature is reported at step 480, along with dE and dF and the associated etch recipe, which is sent to etcher 370 to adjust (or "update") the etch recipe to correct the CD deviation of the finished features on wafer W. The etch recipes can typically adjust the CD within a range of about 10% or less.

The feedback and feed-forward of steps 460 and 480 can be done manually or automatically. In "manual mode", the user takes the reported process correction information and implements it manually at photo cell 360 and/or etcher 370. This allows expert input from the user to decide the need for process adjustment. In "automatic mode", the process correction information is automatically fed to the stepper in photo cell 360 or to etcher 370 to effect the correction through recipe updating. This mode can be implemented by a software interface allowing communication between processor 320 and etcher 370, and between processor 320 and photo cell 360. The predetermined threshold test of step 470 can be used as a sensitivity filter to determine if updating is necessary. The automatic mode is advantageous because it enables quick feedback and consistency.

The above embodiment of the present invention has been described relative to a "golden waveform" technique. However, it should be realized that any SEM CD measurement technique capable of correlating an FEM cell (or dEdF) to an etch recipe and to feature profile and/or cross-section can be used to implement the present invention. An example of such a technique is discussed in "An Inverse Scattering Approach to SEM Line Width Measurements", Mark P. Davidson and Andras E. Vladar, Proceedings of SPIE, Vol 3677 (1999), the entire disclosure of which is hereby incorporated by reference. In this technique, SEM waveforms are matched to a library of Monte Carlo simulations to predict the sidewall shape and dimensions of a feature (i.e., the feature profile).

Typically, the present methodology is carried out after a lot of wafers, such as about 25 wafers, is processed by photo cell 360. A number of wafers W from the lot are selected to be inspected, according to the user's preference. For example, when manufacturing microprocessors, 1–3 wafers are typically selected for inspection; however, when manufacturing memory devices such as DRAMs, only one wafer is typically inspected per lot. A number of sites on each selected wafer W are usually inspected by the present methodology (i.e., to be target features at step 430), such as about 9–17 sites per wafer W.

To determine the etch recipe to be implemented at step 480 when a number of target features from one or more wafers W in a lot are inspected, the CDs of all the target features of the lot can be averaged, and the etch recipe associated with the average CD used to adjust the etch processing of the lot. To determine the stepper focus and exposure information (dEdF) fed back to photo cell 360 at step 460 to adjust the photolithographic processing of following lots when a number of target features in a lot are inspected, the user can employ previously gathered process information to decide which sites on selected wafers W to inspect, and then decide which inspected feature's information to use to adjust photo cell 360.

Figure 4B:
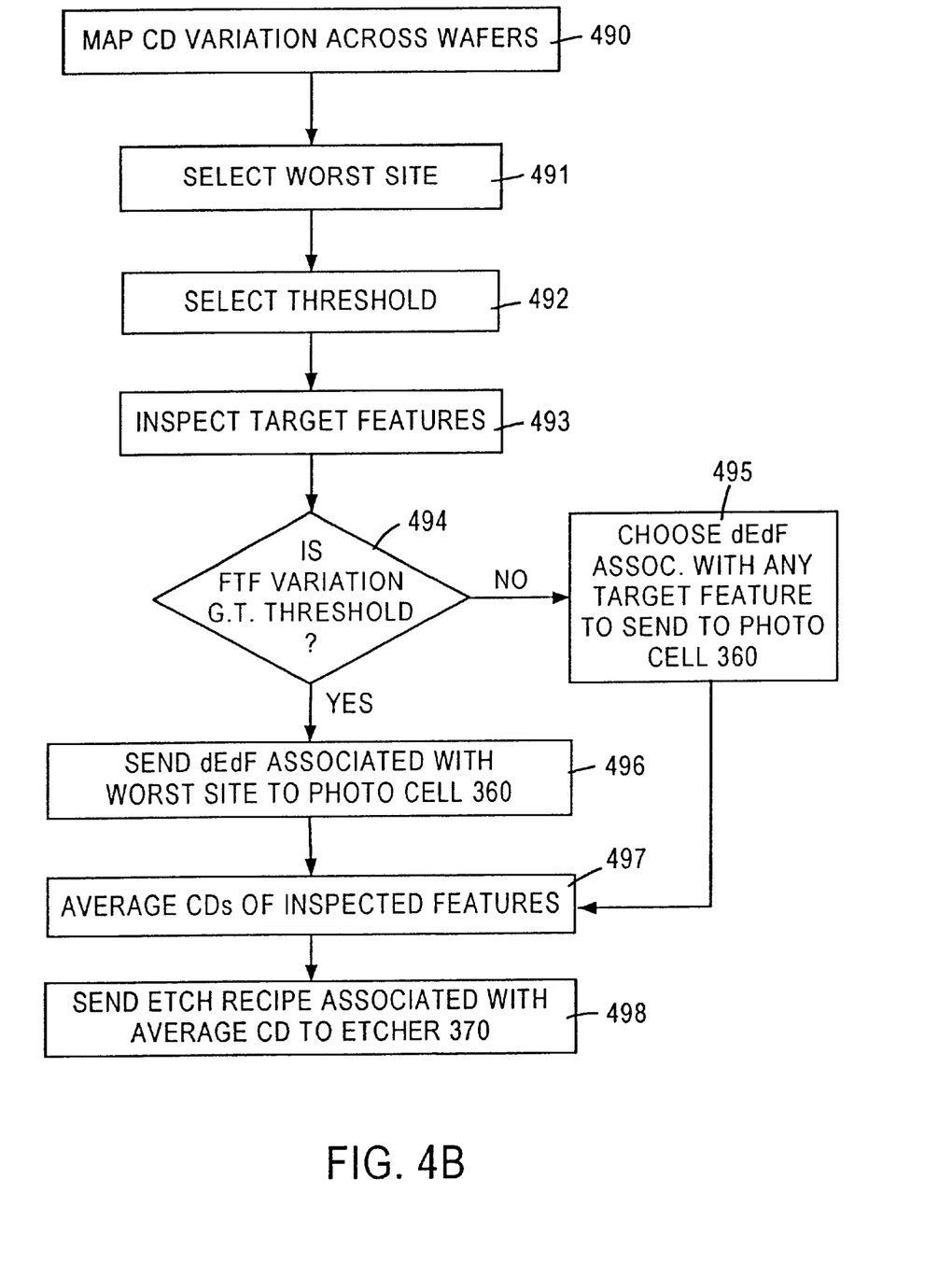

This is illustrated in FIG. 4B, which is a flow chart of an embodiment of the invention. At step 490, the user maps field to field CD variations across a number of wafers prior to inspection using the present methodology. This is a standard process control technique practiced by virtually all wafer fabricators. It indicates which areas of the wafer typically have small CD variations from the design value, and which areas of the wafer typically have a large CD variation. For example, some wafer processing equipment (e.g., photo cell 360) produces wafers having a small CD variation in the center of the wafer and larger CD variations at the periphery. Other equipment produces wafers having large CD variations near the center of the wafer and small CD variations in a band surrounding the center. After mapping the CD variations, the user identifies, at step 491, an area or areas of the wafers that exhibit the worst CD variation.

Next, the user selects a threshold CD variation representing the smallest CD deviation the user wishes to correct (see step 492). Target features are then inspected at step 493 using the inventive methodology (e.g., steps 430 et seq. described above). Target features are selected such that fields in the worst part of the wafer, identified at step 491, are represented. If the field to field variation of the inspected features is smaller than the predetermined threshold (see step 494), dEdF associated with any one of the target features can be fed back to photo cell 360 for use in adjusting the processing of subsequent lots (step 495), since they are relatively close to each other. On the other hand, if the field to field variation of the inspected features is larger than the threshold value selected in step 492, dEdF associated with an inspected feature from the predetermined worst site from step 491 is fed back to photo cell 360 (see step 496). Thus, the worst CD variation is corrected in subsequent lots.

At step 497, the CDs of the inspected features are averaged, and at step 498, the etch recipe associated with the average CD is fed forward to etcher 370 to adjust (or "update") the etch recipe to correct the CD deviation of the features on the wafers in the inspected lot. Thus, this embodiment of the present invention allows the user to employ information, such as field to field CD variation maps, that they gather as a matter of course independently of implementing the present invention, to reduce lot to lot variation with minimal added cost and inspection time.

Figure 5:
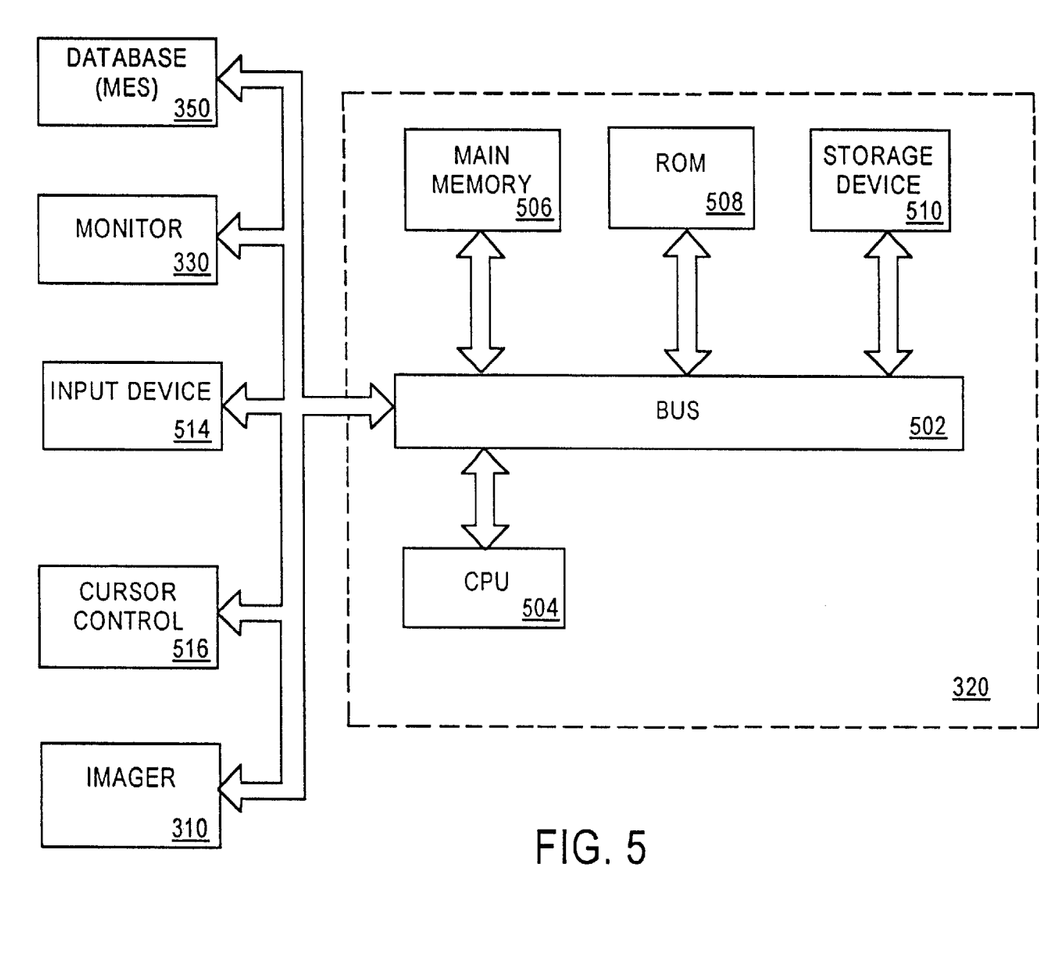
FIG. 5 is a block diagram that illustrates an embodiment of the invention.

FIG. 5 is a block diagram that illustrates an embodiment of the invention. According to this embodiment, processor 320, as shown in FIG. 5, includes a bus 502 or other communication mechanism for communicating information, and a central processing unit 504 coupled with bus 502 for processing information. Processor 320 also includes a main memory 506, such as a random access memory (RAM) or other dynamic storage device, coupled to bus 502 for storing information and instructions to be executed by CPU 504. Main memory 506 also may be used for storing temporary variables or other intermediate information during execution of instructions to be executed by CPU 504. Processor 320 further includes a read only memory (ROM) 508 or other static storage device coupled to bus 502 for storing static information and instructions for CPU 504. A storage device 510, such as a magnetic disk or optical disk, is provided and coupled to bus 502 for storing information and instructions. Storage device 510 may also serve as memory 340 in FIG. 3.

Processor 320 may be coupled via bus 502 to monitor 330, such as a cathode ray tube (CRT), for displaying information to a computer user. An input device 514, including alphanumeric and other keys, is coupled to bus 502 for communicating information and command selections to CPU 504. Another type of user input device is cursor control 516, such as a mouse, a trackball, or cursor direction keys for communicating direction information and command selections to CPU 504 and for controlling cursor movement on monitor 330.

Imager 310 (FIG. 3) inputs data representative of features of a semiconductor wafer under inspection, as discussed above, to bus 502. Such data may be stored in main memory 506 and/or storage device 510, and used by CPU 504 as it executes instructions. Imager 310 may also receive instructions via bus 502 from CPU 504.

The invention is related to the use of processor 320 for inspecting features formed on the surface of a semiconductor wafer and controlling processing of the wafer. According to one embodiment of the invention, inspection of the surface of the wafer and wafer process control is provided by processor 320 in response to CPU 504 executing one or more sequences of one or more instructions contained in main memory 506. Such instructions may be read into main memory 506 from another computer-readable medium, such as storage device 510. Execution of the sequences of instructions contained in main memory 506 causes CPU 504 to perform the process steps described above. One or more processors in a multi-processing arrangement may also be employed to execute the sequences of instructions contained in main memory 506. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow chart of FIG. 4.

The term "computer-readable medium" as used herein refers to any medium that participates in providing instructions to CPU 504 for execution. Such a medium may take many forms, including but not limited to, non-volatile media, volatile media, and transmission media. Non-volatile media include, for example, optical or magnetic disks, such as storage device 510. Volatile media include dynamic memory, such as main memory 506. Transmission media include coaxial cable, copper wire and fiber optics, including the wires that comprise bus 502. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 504 for execution. For example, the instructions may initially be borne on a magnetic disk of a remote computer. The remote computer can load the instructions into its dynamic memory and send the instructions over a telephone line using a modem. A modem local to processor 320 can receive the data on the telephone line and use an infrared transmitter to convert the data to an infrared signal. An infrared detector coupled to bus 502 can receive the data carried in the infrared signal and place the data on bus 502. Bus 502 carries the data to main memory 506, from which CPU 504 retrieves and executes the instructions. The instructions received by main memory 506 may optionally be stored on storage device 510 either before or after execution by CPU 504.

Figure 6A:
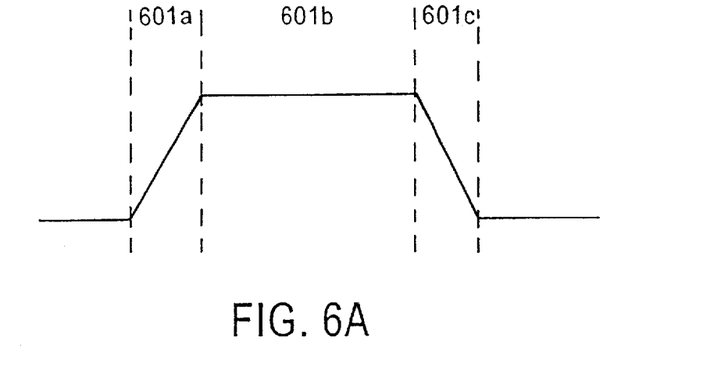
FIG. 6A is a view of a profile of a feature to be inspected using the methodology of the present invention.
Figure 6B:
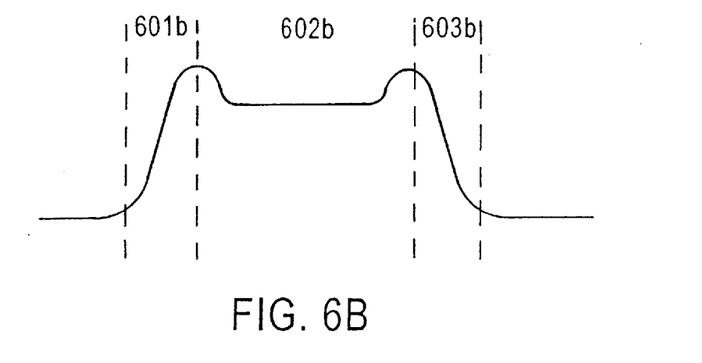
FIGS. 6B and 6C are graphical representations of waveforms used in practicing an embodiment of the present invention.
Figure 6C:
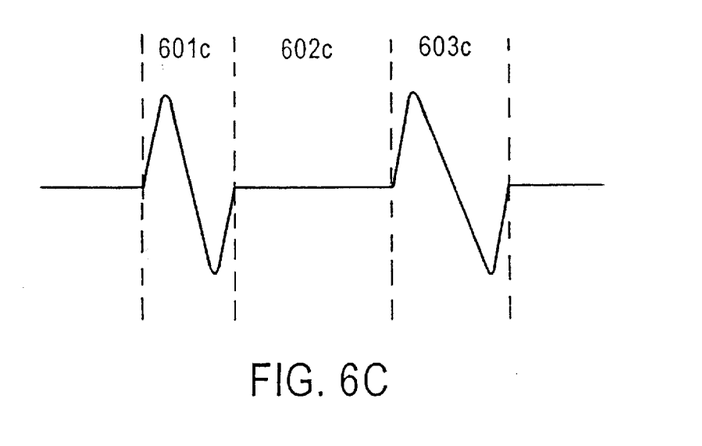

In another embodiment of the invention, the step of comparing the target waveform to the golden waveform (see FIG. 4A, step 440) and the step of matching the target waveform to one of the reference waveforms (step 450) comprise comparing only a selected portion of the target waveform and the reference/golden waveforms which represents a significant feature of the profile under inspection. By analyzing only a portion of the waveforms containing the most pertinent information, processing time is reduced. FIG. 6A depicts a typical feature profile, FIG. 6B shows the corresponding SEM waveform of the feature of FIG. 6A, and FIG. 6C is a graphical representation of the first derivative of the SEM waveform of FIG. 6B. Since portions 601*a* and 603*a* are the most important areas of the feature profile to be inspected, and correspond to segments 601*b* and 603*b* of the SEM waveform in FIG. 6B and segments 601*c* and 603*c* of the first derivative shown in FIG. 6C, it is advantageous to match segments 601*c* or 603*c* of the first derivatives of the target and reference waveforms.

Figure 6D:
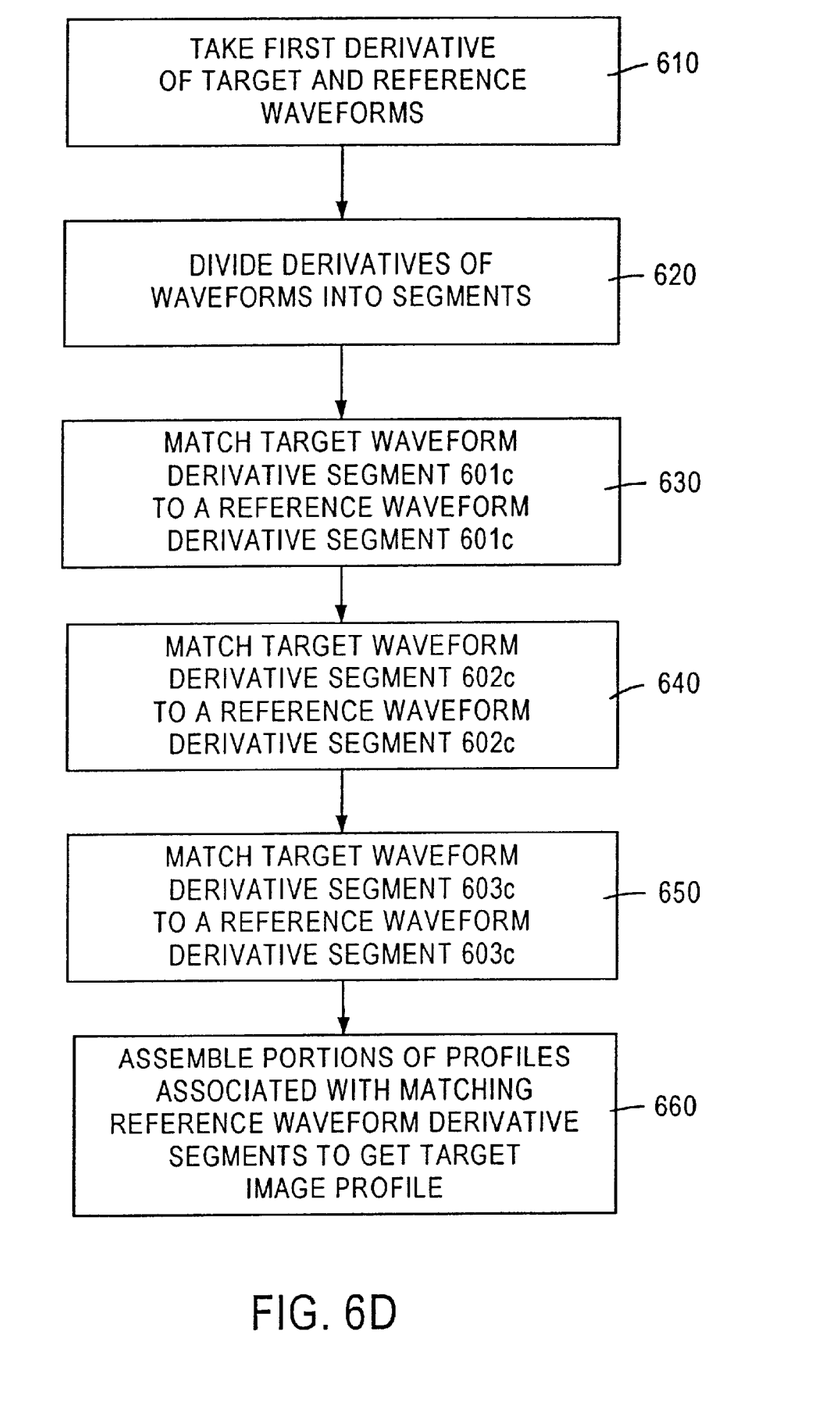
FIG. 6D is a flow chart illustrating sequential steps in a method according to an embodiment of the present invention.

In still another embodiment of the invention, as illustrated in the flow chart of FIG. 6D, if the target waveform does not match the golden waveform in step 440 of the flow chart of FIG. 4A, the first derivative of the target and reference waveforms are taken (step 610), and divided into segments at step 620, such as segments 601*c*, 602*c* and 603*c* in FIG. 6C. Then, each of segments 601*c*, 602*c* and 603*c* of the derivative of the target waveform is separately matched to a corresponding segment of the derivative of a reference waveform (see steps 630, 640, 650), which is associated with a portion of a known profile (e.g., portion 601*a*, 602*a*, 603*a* of FIG. 6A). Thus, the profile of the target feature is predicted by assembling "building blocks" of matching segments (step 660). An examination of the predicted profile will indicate what part or parts of the profile deviate from design standards, and such information can be used by one skilled in the art to trace photolithographic processing problems, such as focus and exposure problems.

In a further embodiment of the present invention, the step of comparing the target waveform to the golden waveform (step 440) and the step of matching the target waveform to one of the reference waveforms (step 450) comprise employing an algorithm to "fit a curve" to the target and reference SEM waveforms such as depicted in FIG. 6B; that is, to obtain a mathematical function or "formula" representative of the shape of each of the waveforms. Then, corresponding significant elements of the mathematical functions representative of the target and reference waveforms are compared to determine which reference image most closely matches the target image. For example, if the target and reference waveforms are represented by the function $y=F(x, a, b)$, the reference waveform whose values of x, a and b most closely match the x, a and b values of the target waveform is the reference waveform that most closely matches the target waveform.

In a still further embodiment of the present invention, the step of comparing the target waveform to the golden waveform (step 440) and the step of matching the target waveform to one of the reference waveforms (step 450) comprise using the target and reference waveforms to generate images of the target feature and the reference features, and then comparing the generated images. In other words, SEM waveforms as illustrated in FIG. 6B arc manipulated using conventional computer graphics techniques to generate images as shown in FIG. 6A. The generated images are then matched, as by well-known pattern recognition techniques such as boundary analysis and grey-scale analysis.

The inventive process control technique enables lot to lot CD variations to be reduced without significantly reducing production throughput by using data gathered during the inspection process to adjust photolithography and etch process parameters. The inventive methodology determines an inspected feature's stepper settings and optimal etch recipe by comparing its SEM waveform with the waveforms of a library of reference features obtained by forming a pre-production FEM. Therefore, the present invention is especially useful during the start-up and ramp-up of a production line.

The present invention is applicable to the manufacture of various types of semiconductor devices, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of controlling the processing of a semiconductor wafer, which method comprises:

performing a photolithographic process on the wafer;

imaging to obtain a critical dimension (CD) of a target feature on the wafer formed using the photolithographic process;

providing a reference CD;

comparing the target feature CD to the reference CD;

providing an etch recipe for an etch process;

modifying the etch recipe when the target, feature CD differs from the reference CD based on the difference between the target feature CD and the reference CD; and performing the etch process on the wafer based on the modified etch recipe when the target feature CD differs from the reference CD.

2. The method of claim 1, comprising:

determining a set of stepper focus and exposure settings for the photolithographic process based on the difference between the target feature CD and reference CD; and performing the photolithographic process on another semiconductor wafer using the set of stepper focus and exposure settings.

3. The method of claim 2, wherein modifying the etch recipe comprises:

forming a plurality of reference features on a reference semiconductor wafer, the reference features having a CD comparable to the target feature CD, each of the reference features respectively associated with a different etch recipe;

identifying the reference feature whose CD most closely matches the target feature CD; and using the etch recipe associated with the matching reference feature as the modified etch recipe.

4. The method of claim 3, wherein one of the reference features has the reference CD, the method comprising:

selecting the reference feature having the reference CD as a golden feature;

comparing the target feature CD with the golden feature CD; and comparing the target feature CD to other reference feature CDs in the library to identify the reference feature CD that most closely matches the target feature CD when the target feature CD deviates from the golden feature CD by more than a predetermined threshold amount.

5. The method of claim 4, wherein each reference feature is further associated with a different known set of stepper focus and exposure settings, the method comprising performing the photolithographic process on another semiconductor wafer responsive to the focus and exposure settings associated with the reference feature whose CD most closely matches the target feature CD.

6. The method of claim 4, wherein the photolithographic process is performed on the wafer using a set of initial stepper focus and exposure settings, the method comprising performing the photolithographic process on the other wafer using the initial focus and exposure settings when the target feature CD deviates from the golden feature CD less than the predetermined threshold amount.

7. The method of claim 5, comprising forming the reference features as a focus-exposure matrix (FEM).

8. The method of claim 4, wherein the etch recipes associated with the reference features other than the golden feature are for compensating for the deviations of the target feature CD from the golden feature CD when the, target feature CD deviates from the golden feature CD by more than the predetermined threshold amount.

9. The method of claim 4, wherein the etch recipes are for adjusting the target feature CD during the etch process.

10. The method of claim 5, wherein the stepper focus and exposure settings associated with the reference features other than the golden feature are for compensating for the deviations of the target feature CD from the golden feature CD when the target feature CD deviates from the golden feature CD by more than the predetermined threshold amount.

11. A method of controlling the processing of a semiconductor wafer, which method comprises:

performing a photolithographic process on the wafer;

imaging to obtain a target waveform of a target feature on the wafer formed using the photolithographic process;

determining an etch recipe for an etch process based on the target waveform; and performing the etch process on the wafer based on the etch recipe.

12. The method of claim 11, comprising:

determining a set of stepper focus and exposure settings for the photolithographic process responsive to the target waveform; and performing the photolithographic process on another semiconductor wafer using the set of stepper focus and exposure settings.

13. The method of claim 12, wherein determining the etch recipe comprises:

forming a plurality of reference features on a reference semiconductor wafer, the reference features having a waveform comparable to the target waveform, each of the reference features respectively associated with a different etch recipe; and identifying the reference waveform that most closely matches the target waveform to obtain the etch recipe for performing the etch process.

14. The method of claim 13, comprising:

selecting one of the reference waveforms as a golden waveform;

comparing the target waveform with the golden waveform; and comparing the target waveform to other reference waveforms in the library to identify the reference waveform that most closely matches the target waveform when the target waveform deviates from the golden waveform by more than a predetermined threshold amount.

15. The method of claim 14, wherein each reference feature is further associated with a different known set of stepper focus and exposure settings, the method comprising performing the photolithographic process on another semiconductor wafer responsive to the focus and exposure settings associated with the reference waveform that most closely matches the target waveform.

16. The method of claim 14, wherein the photolithographic process is performed on the wafer using a set of initial stepper focus and exposure settings, the method comprising performing the photolithographic procession the other wafer using the initial focus and exposure settings when the target waveform deviates from the golden waveform less than the predetermined threshold amount.

17. The method of claim 15, comprising forming the reference features as a focus-exposure matrix (FEM).

18. The method of claim 14, wherein the etch recipes associated with the reference features other than the reference feature associated with the golden waveform are for compensating for the deviations of the target waveform from the golden waveform when the target waveform deviates from the golden waveform by more than the predetermined threshold amount.

19. The method of claim 14, wherein the etch recipes are for adjusting the target feature CD during the etch process.

20. The method of claim 15, wherein the stepper focus and exposure settings associated with the reference features other than the reference feature associated with the golden waveform are for compensating for the deviations of the target waveform from the golden waveform when the target waveform deviates from the golden waveform by more than a predetermined threshold amount.

* * * * *